United States Patent
Tankielun

(10) Patent No.: US 10,826,630 B2
(45) Date of Patent: Nov. 3, 2020

(54) MEASURING DEVICE, SYSTEM AND METHOD FOR WIRELESSLY MEASURING RADIATION PATTERNS

(71) Applicant: Rohde & Schwarz GmbH & Co. KG, Munich (DE)

(72) Inventor: Adam Tankielun, Ottobrunn (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 0 days.

(21) Appl. No.: 14/609,701

(22) Filed: Jan. 30, 2015

(65) Prior Publication Data
US 2016/0226607 A1  Aug. 4, 2016

(51) Int. Cl.
| | | |
|---|---|---|
| H04L 5/14 | (2006.01) | |
| H03H 7/46 | (2006.01) | |
| H04L 12/801 | (2013.01) | |
| H04B 17/318 | (2015.01) | |
| H04B 17/24 | (2015.01) | |
| G01R 29/10 | (2006.01) | |
| H04W 24/10 | (2009.01) | |

(52) U.S. Cl.
CPC ........... *H04B 17/318* (2015.01); *G01R 29/10* (2013.01); *H04B 17/24* (2015.01); *H04W 24/10* (2013.01)

(58) Field of Classification Search
CPC ...... H04B 10/07; H04B 3/46; H04B 17/0085; H04B 17/101; H04B 17/12; H04B 17/30; H04B 17/402; H04B 17/102
See application file for complete search history.

(56) References Cited

U.S. PATENT DOCUMENTS

| | | | | |
|---|---|---|---|---|
| 8,138,778 B1 * | 3/2012 | Smith | ................ | G01R 31/2808 324/756.02 |
| 2003/0133422 A1 * | 7/2003 | Bims | ....................... | H04L 45/00 370/328 |
| 2005/0212902 A1 * | 9/2005 | Cook | ..................... | H04N 1/506 347/248 |
| 2006/0194552 A1 * | 8/2006 | Jin | ....................... | H04B 17/318 455/226.1 |
| 2007/0225003 A1 * | 9/2007 | Cheng | ................... | H04W 28/00 455/450 |
| 2007/0225033 A1 * | 9/2007 | Yoon | ...................... | H01Q 1/362 455/552.1 |
| 2008/0112491 A1 * | 5/2008 | Shaanan | ............... | H03M 13/03 375/253 |

(Continued)

OTHER PUBLICATIONS

"Test Systems: Over-The-Air Test Lab", ETS Lindgren, www.etslindgren.com, 2 pages.

(Continued)

*Primary Examiner* — Diane L Lo
*Assistant Examiner* — Abusayeed M Haque
(74) *Attorney, Agent, or Firm* — Lee & Hayes, P.C.

(57) ABSTRACT

An inventive measuring device comprises a measuring unit, a communication unit and a control unit. The measuring unit is adapted to wirelessly receive a measuring signal transmitted by a device under test. The control unit is adapted to derive at least one measuring device, especially a signal level, from the received measuring signal. The communication unit is adapted to only wirelessly transmit the at least one measuring result to a central measuring unit, not being part of the measuring device.

20 Claims, 5 Drawing Sheets

(56) References Cited

U.S. PATENT DOCUMENTS

| | | | |
|---|---|---|---|
| 2009/0051366 A1* | 2/2009 | Miyauchi | G01R 31/2822 324/537 |
| 2009/0094492 A1* | 4/2009 | Music | G06F 11/261 714/715 |
| 2009/0154384 A1* | 6/2009 | Todd | H04W 28/02 370/311 |
| 2011/0084887 A1* | 4/2011 | Mow | G01R 29/10 343/703 |
| 2011/0115468 A1* | 5/2011 | Kantake | G01R 31/31922 324/76.77 |
| 2012/0207030 A1* | 8/2012 | Luong | H04W 24/06 370/245 |
| 2012/0213112 A1* | 8/2012 | Olgaard | H04L 43/0847 370/252 |
| 2012/0221277 A1* | 8/2012 | Gregg | H04B 17/11 702/106 |
| 2013/0049786 A1* | 2/2013 | El-Hassan | H04B 17/0085 324/756.01 |
| 2013/0181733 A1* | 7/2013 | Kikuchi | G01R 31/2893 324/750.03 |
| 2013/0335101 A1* | 12/2013 | Kato | G01R 1/206 324/537 |
| 2014/0097758 A1* | 4/2014 | Recker | H05B 47/19 315/152 |
| 2014/0330533 A1* | 11/2014 | Gadlage | G11C 29/56 702/120 |
| 2014/0355457 A1* | 12/2014 | Huang | H04W 24/10 370/252 |
| 2015/0055131 A1* | 2/2015 | Ono | G01M 11/0207 356/244 |
| 2015/0124253 A1* | 5/2015 | McCord | G01J 3/0262 356/326 |
| 2015/0237578 A1* | 8/2015 | Gogate | H04W 52/029 370/311 |
| 2016/0139565 A1* | 5/2016 | Chen | H02J 50/001 368/80 |
| 2016/0306025 A1* | 10/2016 | Nicolas | G01S 5/0252 |
| 2016/0363833 A1* | 12/2016 | Mende | G02F 1/225 |

OTHER PUBLICATIONS

"Test System SG 24—A Multi-Probe Antenna Measurement System" Version 2014, 8 pages.

\* cited by examiner

MEASURING DEVICE, SYSTEM AND METHOD FOR WIRELESSLY MEASURING RADIATION PATTERNS

TECHNICAL FIELD

The invention relates to a measuring device, a measuring system and a measuring method for measuring radiation patterns of devices under test, especially mobile telephones.

BACKGROUND ART

For measuring the radiation pattern of mobile telephones, complex measurement set-ups are so far necessary. Within a shielded test chamber, one or more antennas are arranged around the device under test. While the device under test is radiating, the one or more antennas are moved with regard to the device under test so that measurements from all directions can be made. The individual measurement antennas are connected to a measuring device, which measures the received signals and processes them. The antennas are connected to the measuring device using cable connections. This results in scattering from the cable connections, which have to be suppressed or prevented so as not to influence the measurements. This is done by using absorbing material. Therefore, a very complex set-up due to the necessity of a measuring chamber and extensive shielding is required while at the same time due to the necessary movement of the measuring antennas, a long measuring time is necessary.

The document US 2011/0084887 A1 shows a measuring set-up using a sphere of measuring antennas arranged around a device under test. Without the necessity of moving the measuring antennas with regard to the device under test, the measurements for all angles can be made within a short measuring time. The measuring set-up shown in this document though is also disadvantageous, since due to the cable connection of the individual measuring antennas, a great effort for absorbing and shielding is necessary.

Accordingly, one object of the invention is to provide a measuring device, measuring system and measuring method, which allow for a very fast measurement of a large number of measurement angles while at the same time requiring only a low hardware effort.

SUMMARY OF THE INVENTION

According to one aspect of the invention, the measuring device comprises a measuring unit, a communication unit and a control unit. The measuring unit is adapted to wirelessly receive a measuring signal transmitted by a device under test. The control unit is adapted to derive at least one measuring result, especially a signal level, from the received measuring signal. The communication unit is adapted to only wirelessly transmit the at least one measuring result to a central measuring unit, not being part of the measuring device. By arranging a plurality of such measuring devices around the device under test, it is thereby possible to simultaneously perform measurements for all measuring angles. Since the measuring results are transmitted wirelessly, a wired connection to the individual measuring devices is not necessary. Thereby, extensive absorbing and shielding measures are not necessary.

Advantageously, the measuring device is adapted to be only wirelessly connected to any further units. Thereby, the need for extensive shielding can be further reduced.

Preferably, the measuring device comprises a power supply unit adapted to only wirelessly received power. The measuring device is adapted to be exclusively powered by the wirelessly received energy. It is thereby possible to omit power transmission cables and thereby further reduce scattering. This allows for a very accurate measuring result while at the same time reducing the need of absorbing.

Preferably, the power supply unit comprises an energy storage unit adapted to store the wirelessly received power. The power supply unit is adapted to power the measuring device exclusively from an energy stored in the energy storage unit. It is thereby possible to transmit power to the measuring device while no measurement is performed. While the measurement is actually performed, it is not necessary to continue transmitting power to the device under test. A further increase in measuring result quality can thereby be achieved.

Preferably, the power supply unit comprises a power reception unit adapted to receive the wirelessly received power. The power reception unit is an RF-antenna or a solar cell or a magnetic resonator. The power reception unit is adapted to receive only ambient power from ambient light, ambient RF-radiation or ambient magnetic fields. Also an energy harvesting from a temperature difference is possible. This would be achieved by use of a Peltier element. Alternatively, the power reception unit is adapted to receive only wirelessly transmitted power from a central power unit. It is thereby possible to either harvest ambient energy without having to provide additional power. This reduces the hardware effort significantly. Alternatively, for higher power consumption measuring device, providing the power by a central power unit allows for a very effective measuring device.

Preferably, the measuring unit comprises at least one strip line measuring antenna on a circuit board. The strip line measuring antenna is adapted to receive the measuring signal. A very low-cost and low-hardware-effort measuring set-up is thereby possible.

Preferably, the measuring unit comprises a further strip line measuring antenna on a further circuit board. The measuring antenna and the further measuring antenna are arranged so that the received orthogonally polarized measuring signals. It is thereby possible to measure two different measuring signals for a single measuring angle regarding two different polarization planes. This further increase the measuring speed, since a second measuring process for the second polarization is not necessary.

Preferably, all further units of the measuring device are mounted on the surface of the at least one circuit board. An especially low-cost hardware-setup is thereby possible.

Further preferably, the communication unit comprises a transmission antenna for transmitting the at least one measurement result as an RF-signal to the central measuring unit. Alternatively, the communication unit comprises an LED for transmitting the at least one measurement result as a visible or infrared or ultraviolet light signal to the central measuring unit. A high flexibility of construction is thereby possible.

According to another aspect of the invention, a measuring system comprises a plurality of before-described measuring devices, a central measuring unit, and a device under test mount adapted for holding the device under test. The measuring devices are arranged around the device under test mount. The communication units of the plurality of measuring devices are adapted to transmit the measuring results to the central measuring unit, while the central measuring unit is adapted to receive the measuring results from the plurality of measuring devices. A very low-cost and low-hardware-effort measuring set-up is thereby possible.

Preferably, the measuring devices are arranged in a circular or spherical pattern around the device under test mount. The measuring devices are adapted to each generate and transmit a measuring result for a single position regarding the device under test. The measuring devices are arranged so that measuring results for a plurality of positions are obtained by the central measuring unit. It is thereby possible to perform all measurements for a single device under test without the need to move the device under test or the measuring devices, in case of a spherical arrangement. In case of a circular arrangement, only a rotation of the device under test is necessary. This results in a very short measuring time.

Preferably, the measuring system comprises a central power unit adapted to wirelessly transmit power to the measuring devices. The central power unit comprises a lamp for transmitting power in the form of visible light or infrared light or ultraviolet light to the measuring devices. Alternatively, the central power unit comprises an RF-antenna for transmitting power in the form of RF-radiation to the measuring devices. In a further alternative, the central power unit comprises a magnetic resonator for transmitting power in the form of a magnetic field to the measuring devices. It is thereby possible to very flexibly construct the measuring system and keep the hardware effort to a minimum.

According to still another aspect of the invention, the measuring method serves the purpose of deriving a plurality of measurement results from a plurality of angles around a device under test. The method comprises transmitting a measuring signal by the device under test, receiving the measuring signal by a plurality of measuring devices arranged in a pattern around the device under test, deriving at least one measuring result from each received measuring signal by the plurality of measuring devices, and wirelessly transmitting the measuring results to a central measuring unit. It is thereby possible to measure all measurement angles for a device under test in one measurement process without having to move the device under test or the respective measuring devices. Also, a very low-hardware-effort can be achieved, since by wirelessly transmitting the measuring results, cable connections from the measuring devices to the central measuring unit are not necessary. Thereby, extensive absorbing and shielding is not necessary.

Preferably, the measuring devices are provided with power exclusively wirelessly. Thereby, power transmission cables can also be omitted, which leads to very low absorbing and shielding requirements.

Preferably, the position and orientation of the device under test and the measuring devices is not changed during a complete measuring process. A further reduction in measuring time is thereby possible.

BRIEF DESCRIPTION OF THE DRAWINGS

An exemplary embodiment of the invention is now further explained by way of example only with respect to the drawings, in which.

DETAILED DESCRIPTION OF THE PREFERRED EMBODIMENTS

Figure 1:
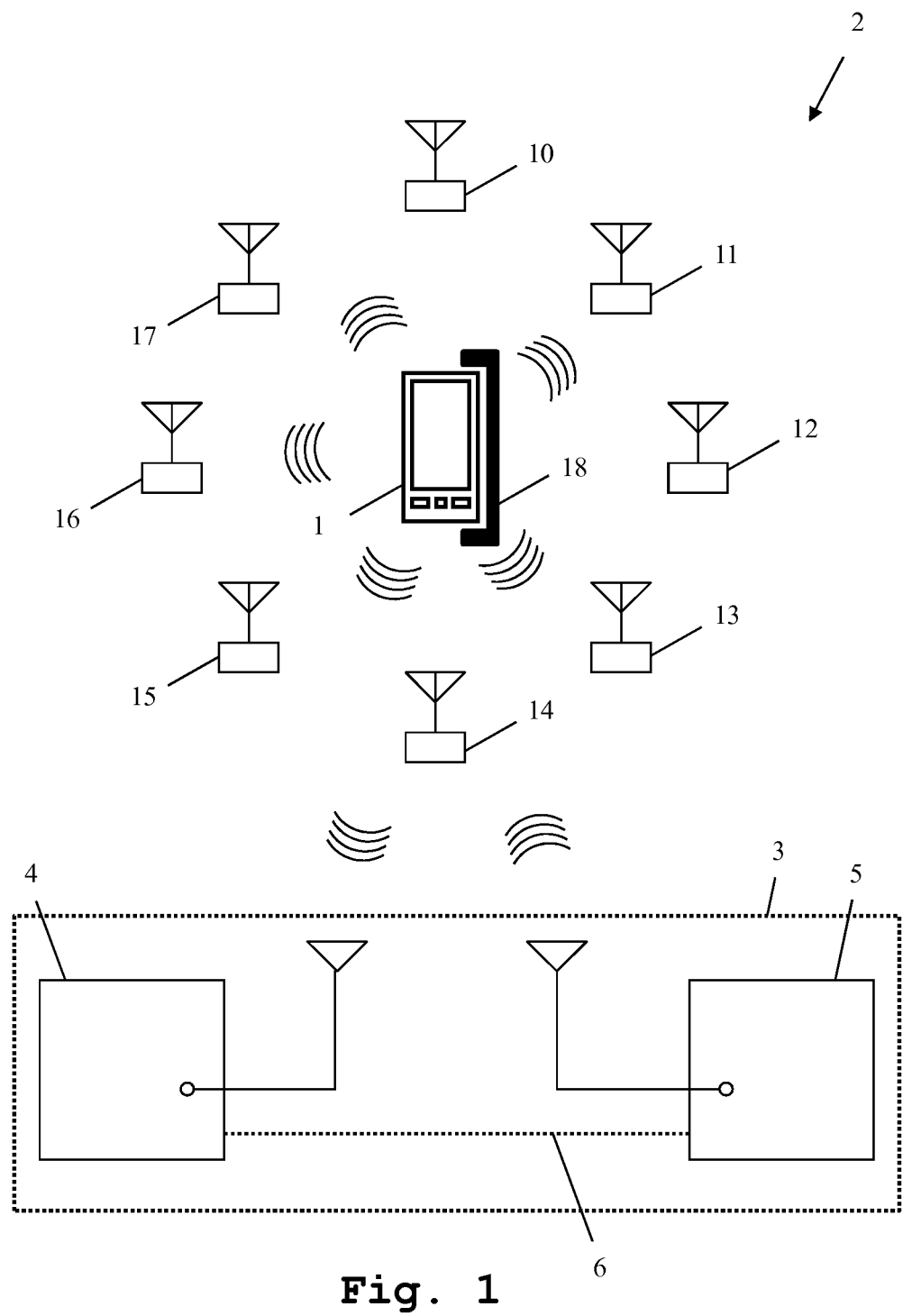
FIG. 1 shows an overview of an embodiment of the inventive measuring system.

Firstly, we demonstrate the general set-up and construction of an embodiment of the inventive measuring system along FIG. 1. Along FIG. 2, the detailed construction and function of an embodiment of the inventive measuring device is described. With use of FIGS. 3 and 4, further aspects of the embodiment of the inventive measuring system are described in detail. Along FIGS. 5 and 6, alternative embodiments of the inventive measuring device are shown. Finally, with regard to FIG. 7, the function of an embodiment of the inventive measuring method is described in detail. Similar entities and reference numbers and different figures have been partially omitted.

Reference will now be made in detail to the preferred embodiments of the present invention, examples of which are illustrated in the accompanying drawings. However, the following embodiments of the present invention may be variously modified and the range of the present invention is not limited by the following embodiments.

First Embodiment

In FIG. 1, an embodiment of the inventive measuring system 2 is shown. The measuring system 2 comprises a device under test mount 18, for holding a device under test 1. Surrounding the device under test mount 18, a plurality of measuring devices 10-17 is arranged. In this example, the measuring devices 10-17 are arranged in a circular pattern around the device under test mount 18. Alternatively, they can be arranged in a cylindrical or spherical pattern. Any pattern, which allows a simultaneous measurement of all necessary measurement angles is possible.

The measurement system 2 furthermore comprises a central unit 3 comprising a central measuring unit 4 and a central power unit 5. The central measuring unit 4 and the central power unit 5 are optionally connected by a wired or wireless interface. The central power unit 5 transmits power wirelessly to the measuring devices 10-17. In this example, the central power unit 5 transmits power in the form of RF-signals using an RF-antenna. The individual measuring devices 10-17 each comprise a power supply unit for receiving the wirelessly transmitted power and powering the respective measuring device 10-17. Details of the construction of the individual measuring devices 10-17 are given with regard to FIG. 2.

Moreover, the central measuring unit 4 wirelessly receives measuring results of the individual measuring devices 10-17. In this example, the measuring results are transmitted as RF-signals wirelessly and received by use of an RF-antenna by the central measuring unit 4.

Since the individual measuring devices 10-17 do not require any wired connections to the central unit 3 or any other unit, extensive absorbing and shielding measures to prevent field scattering from such wired connections are not necessary. If scattering from any surrounding objects are negligible, not even a shielded anechoic chamber is necessary.

Second Embodiment

Figure 2:
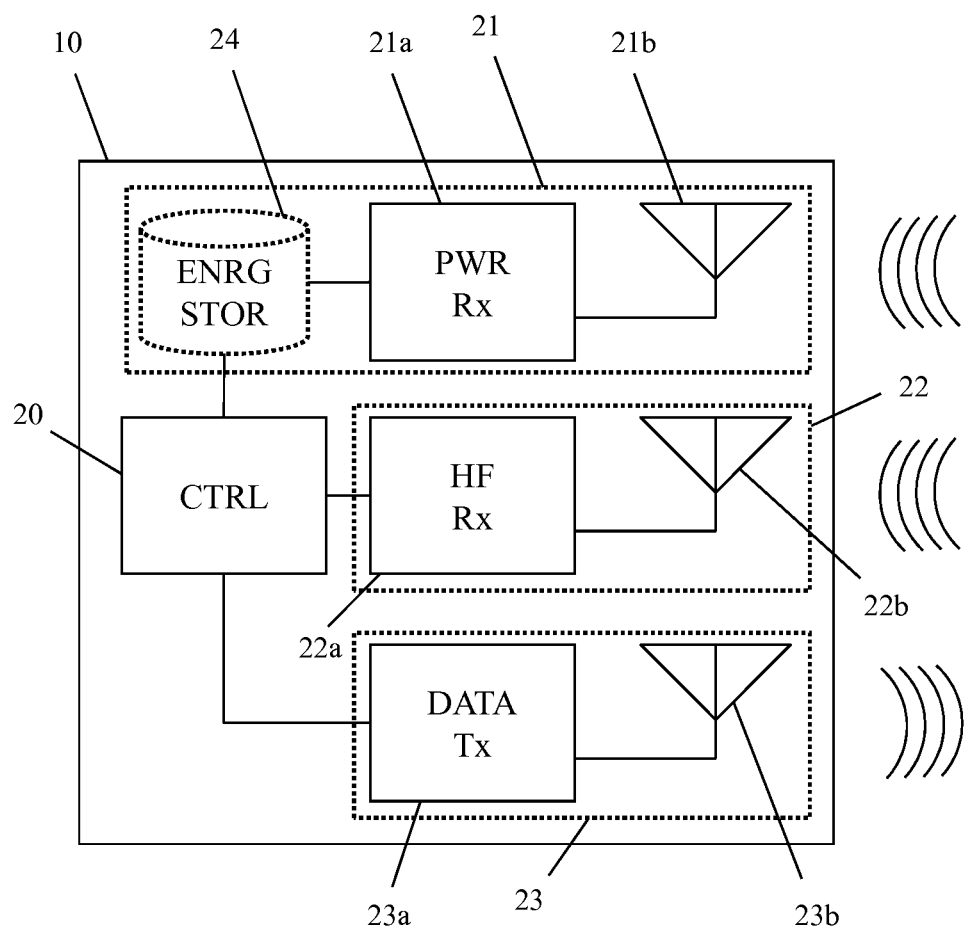
FIG. 2 shows a block diagram of a first embodiment of the inventive measuring device.

In FIG. 2, a first embodiment of the inventive measuring device 10 is shown. All measuring devices 10-17 of FIG. 1 are constructed identically.

The measuring device 10 comprises a control unit 20, a power supply unit 21, a measuring unit 22 and a communication unit 23. The power supply unit 21 comprises an energy storage unit 24, a power processing unit 21*a* and power reception unit 21*b*. The energy storage unit 24 only is an optional component. In case it is present, it is connected to the control unit 20 and to the power processing unit 21*a*. The power reception unit 21*b* is connected to the power processing unit 21*a*. The measuring unit 22 comprises a measuring antenna 22*b* and a measuring processing unit 22*a*. The measuring processing unit 22*a* is connected to the control unit 20 and to the measuring antenna 22*b*. The communication unit 23 comprises a data transmission unit 23*a*, which is connected to the control unit 20 and a transmission antenna 23*b*.

By use of the power supply unit 21, the measuring device 10 receives wirelessly transmitted power. The power reception unit 21*b*, for example an RF-antenna, or a magnetic resonator or a solar cell or a Peltier element receives the wirelessly transmitted power, either ambient power or deliberately transmitted power and hands it to the power processing unit 21*a*. The power processing unit 21*a* brings the wirelessly received power into a usable form and optionally stores it in the energy storage unit 24, in case such a unit is present. Alternatively, if such a unit is not present, the power processing unit 21*a* directly powers the measuring device 10 through a connection to the control unit 20.

If an energy storage unit 24 is present, it is not necessary to receive wireless power during performing measurements. It is then possible to charge the energy storage unit 24 before performing the measurements and then refrain from receiving more power during measurements. An increase in measuring accuracy can thereby be reached.

While performing measurements, the measuring antenna 22*b* receives measuring signals from the device under test 1 as shown in FIG. 1. The received measuring signals are handed to the measuring processing unit 22*a*, which derives measuring results from the received measuring signals. These measuring results are handed on to the control unit 20, which hands them on to the data transmission unit 23*a*, which transmits the measuring results by use of the transmission antenna 23*b*. Instead of a transmission antenna 23*b* as depicted here, alternatively also a transmission using visible light signals or infrared light signals or ultraviolet light signals and for example an LED for generating these signals is possible.

Third Embodiment

Figure 3:
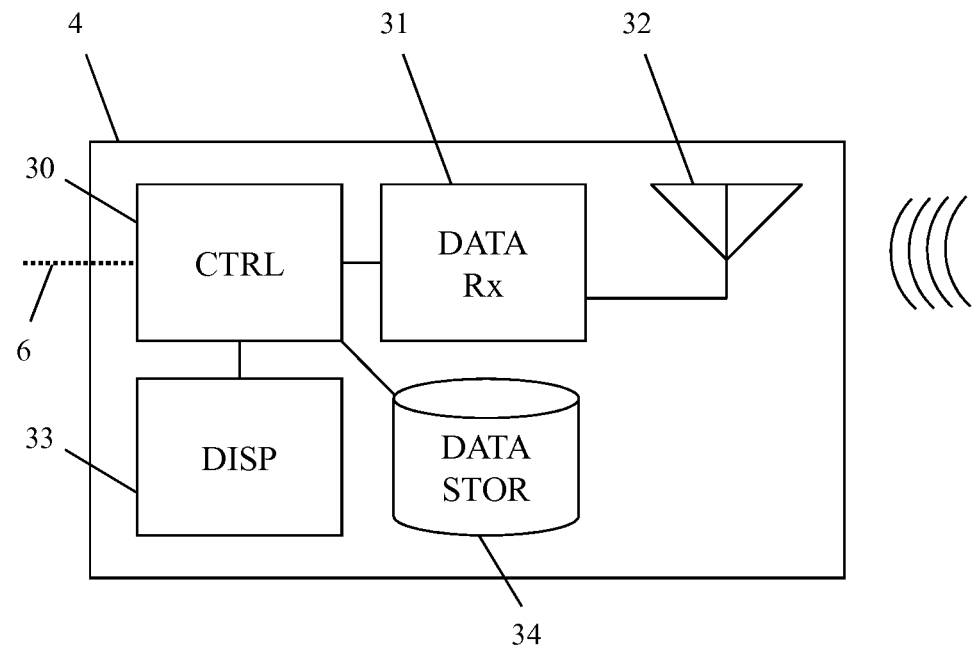
FIG. 3 shows a detailed block diagram of an aspect of the embodiment of the inventive measuring system.

In FIG. 3, a detail of the measuring system 2 of FIG. 1 is shown. Here, the central measuring unit 4 is depicted in greater detail. The central measuring unit 4 comprises a control unit 30 and a data reception unit 31, which is connected to the control unit 30. Moreover, it comprises a data reception antenna 32, which is adapted to receive the wirelessly transmitted measuring results from the measuring devices 10-17 of FIG. 1 and FIG. 2. The central measuring unit 4 furthermore comprises a data storage unit 34, which is connected to the control unit 30. Also it comprises a display unit 33, which is also connected to the control unit 30. The received measuring results are processed by the control unit 30 and stored by the data storage unit 34.

The display unit is adapted to display the received measuring results.

Alternatively, also a receiver for visible light communication or ultraviolet or infrared light communication can be integrated instead of the antenna 32, in case the measuring results are transmitted in this fashion by the measuring devices 10-17. The control unit 30 moreover comprises an optional interface 6 for connecting it to a central power unit 5 as depicted in FIGS. 1 and 4.

Fourth Embodiment

Figure 4:
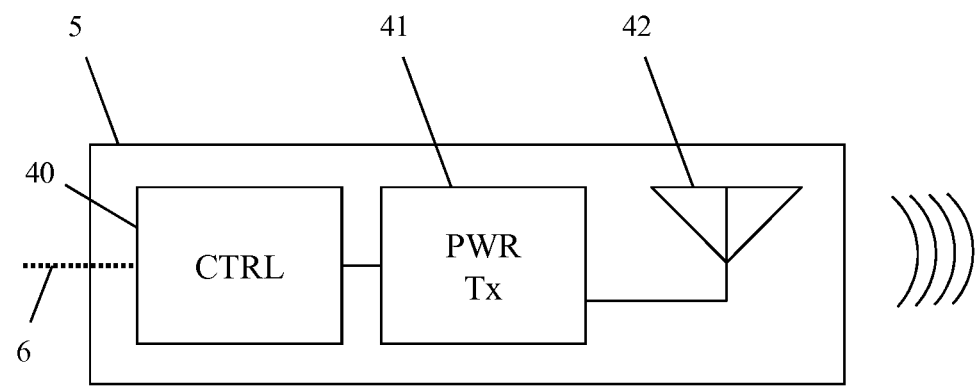
FIG. 4 shows a detailed block diagram of a further aspect of the embodiment of the inventive measuring system.

In FIG. 4, a further detail of the inventive measuring system 2 of FIG. 1 is shown. Here, the central power unit 5 is depicted in greater detail. The central power unit 5 comprises a control unit 40, which is connected to a power transmission unit 41, which again is connected to a power transmission antenna 42. Controlled by the control unit 40, the power transmission unit 41 generates a power transmission signal, which is transmitted by the power transmission antenna 42 and used to wirelessly power the measuring devices 10-17 of FIGS. 1 and 2. The control unit 40 optionally comprises an interface 6 for a connection to a central measuring unit 4 as depicted in FIGS. 1 and 3. Instead of a power transmission antenna, also a lamp or a magnetic resonator can be used for transmitting power.

Alternatively to the construction shown in FIG. 1 of having a separate central measuring unit and central power unit, these components can also be integrated into a single device. This is indicated by the dashed line and the reference number 3 for a central unit 3.

Fifth Embodiment

Figure 5:
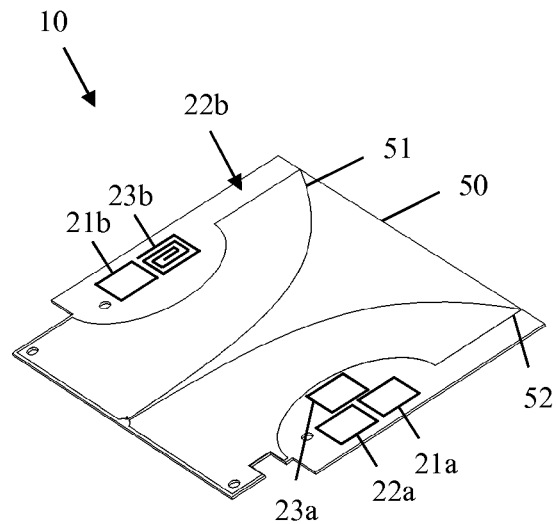
FIG. 5 shows a second embodiment of the inventive measuring device.

In FIG. 5, a further embodiment of the inventive measuring device 10 is shown. Also here it is important to note, that all measuring devices 10-17 of FIG. 1 are identical and can be manufactured in the fashion as depicted here. In FIG. 5, the measuring device 10 comprises a measuring antenna 22*b*, which is comprised of conductive surfaces 51, 52 on a circuit board 50. In addition to the measurement antenna 22*b*, at least some further components, advantageously all further components of the measuring device 10 are mounted on the circuit board 50. Here, on the surface of the circuit board 50, the power processing unit 21*a*, the power reception unit 21*b*, the measuring processing unit 22*a*, the data processing unit 23*a* and the data transmission antenna 23*b* are arranged. It is thereby possible to construct the measuring device 10 with a very low labor and material effort. Also a very small footprint is achieved.

Sixth Embodiment

Figure 6:
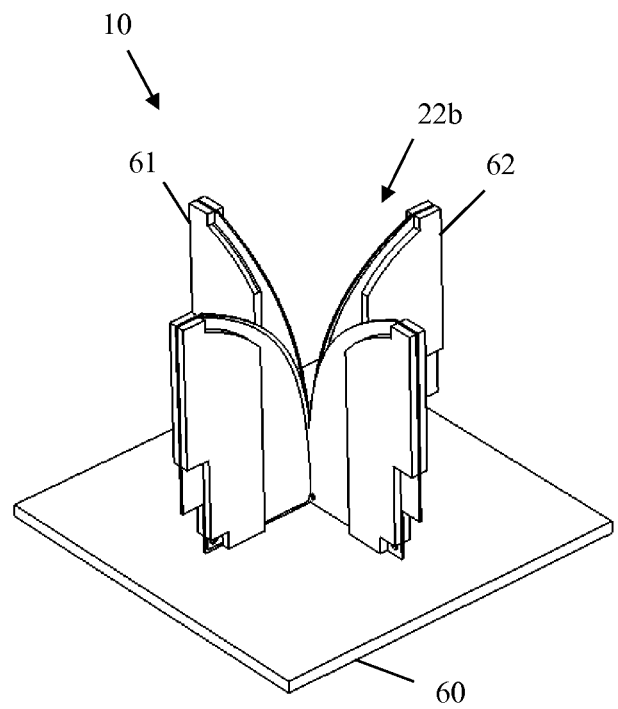
FIG. 6 shows a third embodiment of the inventive measuring device.

In FIG. 6, a further embodiment of the measuring device 10 is shown. Also here, it is important to note, that all measuring devices 10-17 can be manufactured in this matter. The measuring device 10 of FIG. 6 shows two cross-polarized measuring antennas 61, 62, each comprising its own measuring unit. These are not displayed here, though. Therefore the setup of FIG. 6 integrates the measuring cross-polarized signals at a single location into one measuring unit 10. The cross-polarized measuring antennas 61, 62 are mounted on a perpendicular circuit board 60. The circuit board 60 though is not necessary for the present invention. By use of this construction, it is possible to receive two different polarization planes of signals emitted by the device under test simultaneously.

Seventh Embodiment

Figure 7:
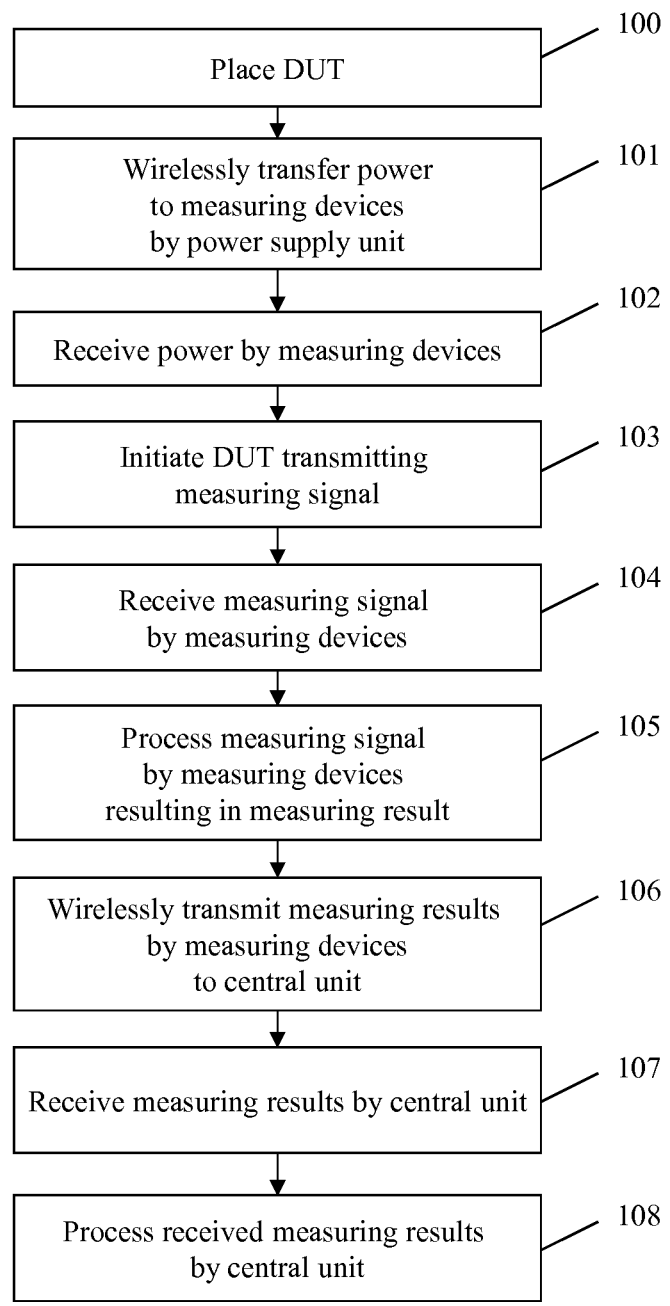
FIG. 7 shows an embodiment of the inventive measuring method in a flow diagram.

In FIG. 7, an embodiment of the inventive measuring method is shown by use of a flow diagram. In a first step 100, the device under test is placed on a device under test mount. The device under test mount can also be the hand of an operator holding the device under test. In a second step 101, power is transferred wirelessly to the measuring devices. This can be ambient energy or power deliberately transmitted by a power supply unit. In a third step 102, the power is received by the individual measuring devices. The measuring devices are powered by this received power. In a fourth step, a measuring signal transmission by the device under test is initiated. In a fifth step 104, the measuring signal is received by the measuring devices. In a sixth step 105, the measuring signal is processed by the measuring devices resulting in measuring results. In a seventh step 106, the measuring results are transmitted wirelessly by the measuring devices to a central unit. In an eighth step 107, measuring results are received by the central unit. In a ninth and final step 108, the received measuring results are processed by the central unit. Optionally, the can be displayed by the central unit.

The embodiments of the present invention can be implemented by hardware, software, or any combination thereof. Various embodiments of the present invention may be implemented by one or more application specific integrated circuits (ASICs), digital signal processors (DSPs), digital signal processing devices (DSPDs), programmable logic devices (PLDs), field programmable gate arrays (FPGAs), processors, controllers, microcontrollers, microprocessors, or the like.

Various embodiments of the present invention may also be implemented in the form of software modules, processes, functions, or the like which perform the features or operations described above. Software code can be stored in a memory unit so that it can be executed by a processor. The memory unit may be located inside or outside the processor and can communicate date with the processor through a variety of known means.

The invention is not limited to the examples. The characteristics of the exemplary embodiments can be used in any combination.

Although the present invention and its advantages have been described in detail, it should be understood, that various changes, substitutions and alterations can be made herein without departing from the spirit and scope of the invention as defined by the appended claims.

The invention claimed is:

1. A measuring system to hold a device under test and to measure a radiation signal from the device under test, the measuring system comprising:
   a device under test mount adapted to hold the device under test;
   a plurality of wireless measuring devices arranged around the device under test mount, each of the plurality of wireless measuring devices comprising:
      a measuring antenna adapted to wirelessly receive the radiation signal from the device under test as a measuring signal;
      at least one of a processor or a hardware element communicatively coupled to the measuring antenna and adapted to derive at least one measuring result from the received measuring signal, the at least one measuring result including a signal level; and
      a light source communicatively coupled to at least one of the processor or the hardware element and adapted to wirelessly transmit the at least one measuring result to a light receiver; and
   the light receiver adapted to receive the respective at least one measuring result from each of the plurality of wireless measuring devices,
   wherein at least one of the plurality of wireless measuring devices is further adapted to wirelessly receive power through a reception element which brings the wirelessly received power into a usable form and is connected to an element adapted to store the received power in the usable form.

2. The measuring system of claim 1,
   wherein at least one of the plurality of wireless measuring devices is adapted to be wirelessly connected to at least a second wireless measuring device.

3. The measuring system of claim 1, wherein at least one of the plurality of wireless measuring devices further comprises at least one of an antenna, a solar cell, a magnetic resonator, or a Peltier element adapted to wirelessly receive energy, wherein the at least one wireless measuring device is adapted to be exclusively powered by the wirelessly received energy.

4. The measuring system of claim 3,
   wherein at least one of the antenna, the solar cell, the magnetic resonator, or the Peltier element of the at least one wireless measuring device includes or is connected to an element adapted to store the wirelessly received power, and
   wherein the at least one wireless measuring device is adapted to be exclusively powered from energy stored in the element.

5. The measuring system of claim 3,
   wherein at least one of the antenna, the solar cell, the magnetic resonator, or the Peltier element of the at least one wireless measuring device is adapted to receive ambient power from at least one of ambient light, ambient RF radiation, or ambient magnetic fields, or
   wherein at least one of the antenna, the solar cell, the magnetic resonator, or the Peltier element of the at least one wireless measuring device is adapted to receive wirelessly transmitted power from at least one of a power transmission antenna, a lamp, or a magnetic resonator.

6. The measuring system of claim 1,
   wherein the measuring antenna of at least one of the plurality of wireless measuring devices includes at least one planar measuring antenna on a circuit board, and
   wherein the planar measuring antenna of the at least one wireless measuring device is adapted to receive the measuring signal.

7. The measuring system of claim 6,
   wherein the measuring antenna of the at least one wireless measuring device includes a further planar measuring antenna on a further circuit board, and
   wherein the measuring antenna and the further measuring antenna of the at least one wireless measuring device are arranged to receive orthogonally polarized measuring signals.

8. The measuring system of claim 6,
   wherein at least one of the processor, the hardware element, or the light source of the at least one wireless measuring device are mounted on the surface of the circuit board.

9. The measuring system of claim 1,
   the light source of at least one of the plurality of wireless measuring devices is adapted to transmit the at least one measuring result as at least one of a visible light signal, an IR light signal, or a UV light signal to the light receiver, the light source comprising an LED.

10. The measuring system of claim 1,
wherein the plurality of wireless measuring devices are arranged in at least one of a circular pattern, a spherical pattern, or a cylindrical pattern around the device under test mount,
wherein the plurality of wireless measuring devices are adapted to each generate and transmit a measuring result for a signal position regarding the device under test, and
wherein the plurality of wireless measuring devices are arranged so that measuring results for a plurality of positions are obtained by the light receiver.

11. The measuring system of claim 1, further comprising:
a lamp for transmitting power in the form of at least one of visible light, IR light, or UV light to the plurality of wireless measuring devices.

12. The measuring system of claim 1, wherein at least one of the plurality of wireless measuring devices further comprises at least one of an antenna, a solar cell, a magnetic resonator, or a Peltier element adapted to wirelessly receive energy, wherein the at least one wireless measuring device is adapted to be powered by the wirelessly received energy.

13. The measuring system of claim 12,
wherein at least one of the antenna, the solar cell, the magnetic resonator, or the Peltier element of the at least one wireless measuring device includes or is connected to an element adapted to store the wirelessly received power, and
wherein the at least one wireless measuring device is adapted to be powered from energy stored in the element.

14. The measuring system of claim 1,
wherein each of the plurality of wireless measuring devices includes the hardware element, the hardware element comprising at least one of an Application Specific Integrated Circuit (ASIC), a Digital Signal Processing Device (DSPD), a Programmable Logic Device (PLD), a Field Programmable Gate Array (FPGA), a controller, or a microcontroller.

15. The measuring system of claim 1, further comprising an RF antenna for transmitting power in the form of RF radiation to the plurality of wireless measuring devices.

16. The measuring system of claim 1, further comprising a magnetic resonator for transmitting power in the form of a magnetic field to the plurality of wireless measuring devices.

17. The measuring system of claim 1, further comprising a heating element for transmitting power in the form of a temperature difference to the plurality of wireless measuring devices.

18. A method of measuring signals from a device under test, the method comprising:
placing a device under test in a device under test mount;
receiving, by each of a plurality of wireless measuring devices arranged in a pattern around the device under test disposed in the device under test mount, a measuring signal;
deriving, by each of the plurality of wireless measuring devices, at least one measuring result from the respective received measuring signal, the at least one measuring result including a signal level;
wirelessly transmitting, by each of the plurality of wireless measuring devices, the respective at least one measuring result to a light receiver; and
receiving, by the light receiver and from each of the plurality of wireless measuring devices, the respective at least one measuring result,
wherein at least one of the plurality of wireless measuring devices is further adapted to wirelessly receive power through a reception element which brings the wirelessly received power into a usable form and is connected to an element adapted to store the received power in the usable form.

19. The measuring method of claim 18,
wherein the plurality of wireless measuring devices are provided with power exclusively wirelessly.

20. The measuring method of claim 18,
wherein the position and orientation of the device under test and the plurality of wireless measuring devices is not changed during a complete measuring process.

* * * * *